United States Patent
Gardner

(10) Patent No.: US 6,469,527 B1
(45) Date of Patent: *Oct. 22, 2002

(54) METHOD OF CALIBRATING A POTENTIOMETER

(76) Inventor: Todd G. Gardner, 1060 Main St., Antioch, IL (US) 60002

( * ) Notice: Subject to any disclaimer, the term of this patent is extended or adjusted under 35 U.S.C. 154(b) by 0 days.

This patent is subject to a terminal disclaimer.

(21) Appl. No.: 09/587,005

(22) Filed: Jun. 5, 2000

Related U.S. Application Data

(63) Continuation of application No. 09/049,889, filed on Mar. 27, 1998, now Pat. No. 6,075,370.

(51) Int. Cl.$^7$ ............................................. G01R 27/08
(52) U.S. Cl. ...................... 324/714; 324/63; 324/158.1; 324/601
(58) Field of Search ................................. 324/247, 254, 324/691, 714, 63, 158.1, 601, 723, 734 T, 701; 338/89, 118, 196, 135, 164, 184; 315/224; 33/203

(56) References Cited

U.S. PATENT DOCUMENTS

| | | | |
|---|---|---|---|
| 2,123,142 A | 7/1938 | McMaster | 235/61 |
| 2,424,146 A | 7/1947 | Caldwell et al. | 175/183 |
| 3,416,084 A | 12/1968 | Julie | 324/98 |
| 3,852,665 A | 12/1974 | Bothner | 324/63 |
| 4,013,946 A | * 3/1977 | Lewis | 324/247 |
| 4,086,519 A | * 4/1978 | Persson | 318/254 |
| 4,178,541 A | * 12/1979 | Brihier | 324/385 |
| 5,565,785 A | 10/1996 | Rodgers et al. | 324/601 |

* cited by examiner

*Primary Examiner*—Michael Sherry
*Assistant Examiner*—Trung Q. Nguyen
(74) *Attorney, Agent, or Firm*—Andrus, Sceales, Starke & Sawall, LLP

(57) ABSTRACT

A method for calibrating a potentiometer that determines the actual resistance of the potentiometer throughout its range of motion. The potentiometer is rotated in a forward direction from its first stop position to its second stop position while resistance measurements are made based on pulses generated by an encoder coupled to the potentiometer. After the forward resistance measurements are made, a set of reverse resistance measurements are made as the potentiometer moves between the second stop position and the first stop position. A microprocessor combines the forward and reverse resistance measurements to generate an average resistance value for each angular position of the potentiometer. An individual label is then printed based on the specific resistance characteristics of the potentiometer being tested.

12 Claims, 5 Drawing Sheets

METHOD OF CALIBRATING A POTENTIOMETER

CROSS REFERENCE TO RELATED APPLICATION

This application is a continuation of U.S. patent application Ser. No. 09/049,889, filed Mar. 27, 1998, now issued as U.S. Pat. No. 6,075,370.

BACKGROUND OF THE INVENTION

The present invention relates to the field of electronic circuit components. More specifically, the invention relates to a method for calibrating individual potentiometers.

Potentiometers are often used to vary the electrical resistance at a particular point in an electric circuit over a range determined by the physical characteristics of the potentiometer itself. Typically, potentiometers are made from an electrically resistive material generally having a connection point at each end, thereby providing a fixed electrical resistance between the two ends. A "wiper" is associated with the potentiometer and is slidably movable between the two ends of the resistive material. The wiper includes a connection point that provides a selectively variable resistance range from approximately the minimum resistance of the potentiometer to the full resistance of the potentiometer. Generally, potentiometers are designated by the maximum possible electrical resistance of the potentiometer, such as 1 K, 5 K, 10 K, 100 K ohms, etc.

In addition to the maximum electrical resistance, potentiometers are further designated by tolerance ranges such as +/−20%, +/−10%, +/−5% or +/−1%. As is the case with almost any electrical component, it is generally less expensive to produce a potentiometer having a +/−20% tolerance than to produce a potentiometer having a +/−5% tolerance. In this respect, there is often a large trade-off between the accuracy of the potentiometer and the cost of the potentiometer.

Additionally, it is also common for the linearity of the potentiometer resistance to vary over the length of the resistive material used in the potentiometer, such that equal movements of the wiper do not always produce equal changes in the resistance. Thus, each potentiometer, regardless of its manufacturing technique, stated tolerance, and quality control, has individual characteristics with respect to its maximum electrical resistance, linearity, and the length of travel of the wiper between its maximum and minimum resistance.

Potentiometers are often used to provide a variable electrical resistance that is critical to the proper operation of the electrical circuit within which it is installed. In these types of applications, the potentiometer is generally provided with a pointer or indicator that provides an indication of the relative position of the wiper with respect to the resistive material of the potentiometer. The indicator interfaces with printed indicia in the form of numbers, letters or graduation marks on a surface in fixed relationship with the potentiometer. The interaction between the indicia and the potentiometer indicator provides a relative indication of the electrical resistance at the wiper connection and thereby the resistance of the potentiometer. Typically, when a potentiometer is manufactured, the indicia are printed on the potentiometer without any testing or measurement of the actual resistive characteristics of the potentiometer.

When a potentiometer is connected in an electrical circuit, changing the potentiometer resistance can have a large effect on the output or function of the circuit in which it is installed. Therefore, in a situation where the electrical resistance of the potentiometer is critical to the performance of the circuit, the interface relationship between the indicator on the potentiometer and the printed indicia must accurately indicate the true electrical resistance of the potentiometer. In applications where relatively small changes in the resistance of the potentiometer have larger effects on the circuit itself, further calibration of the potentiometer is often required.

In this regard, the Rogers et al. U.S. Pat. No. 5,565,785 provides a method for calibrating a potentiometer that provides indicia reflecting a relatively accurate indication of the electrical resistance throughout the resistance range of the particular potentiometer. The '785 patent describes measuring the maximum resistance of the potentiometer, a first resistance at a predetermined location, and a second resistance at some known angle from the first resistance. Based on these three measured resistances and the known angle between two of the resistance values, a series of preset index numbers are used to determine the spacing between the indicia printed on the potentiometer face. In this manner, simple and quick electrical measurements of resistance values and one angle measurement can be used to calibrate the potentiometer.

Although the above-identified method of calibrating a potentiometer somewhat tailors the printed indicia according to the resistance value of the individual potentiometer, the limited number of measurements made on the potentiometer do not provide enough accuracy for many uses of the potentiometer. Therefore, it is particularly desirable to develop a method for calibrating a potentiometer that more accurately determines the potentiometer's resistance values at a larger number of angular positions of the wiper.

It is an object of the present invention to provide a method of calibrating a potentiometer that determines the electrical resistance of the potentiometer at a relatively large number of angular positions of the wiper. It is another object of the invention to provide a method of calibrating a potentiometer that compensates for the inherent hysteresis found in a potentiometer and the inherent hysteresis of the measuring device as result of the wiper flexibility when the wiper is moved in opposite directions within the potentiometer. Finally, it is an object of the invention to provide a method of calibrating a potentiometer that can quickly and accurately produce an average set of resistance values for the entire range of wiper movement within the potentiometer itself.

SUMMARY OF THE INVENTION

The present invention is a method of calibrating a potentiometer or other variable resistance device based on the physical characteristics of the individual potentiometer or device.

The method of the invention involves coupling an encoder to a drive shaft that rotates the wiper within the potentiometer, such that rotation of the wiper results in rotation of the encoder. The encoder is configured to generate an encoder pulse upon a predetermined amount of rotation of the potentiometer wiper.

The potentiometer is coupled to a measuring unit that is configured to determine the resistance of the potentiometer through a simple electronic circuit. Included in the measuring unit is a microprocessor and a data acquisition device (DAQ) such that the microprocessor can determine the resistance of the potentiometer based on a voltage value fed into the data acquisition device. In a first embodiment of the invention, the microprocessor is coupled to the encoder, such that upon receiving a pulse from the encoder, the data acquisition device is triggered to record the voltage representing the resistance of the potentiometer. After recording the voltage, the data acquisition device passes the recorded information to the microprocessor. Since the encoder generates pulses based on a predetermined amount of rotation of the potentiometer wiper, the microprocessor can relate the measured resistance to a change in the angular position of the wiper.

In a second embodiment of the invention, the data acquisition device is coupled to the encoder, such that upon receiving a pulse from the encoder, the data acquisition device records a voltage associated with the potentiometer. In this manner, the data acquisition device compiles an array of voltage values related to each of the encoder pulses. After the entire array has been compiled by the data acquisition device, the microprocessor can read the array and translate the voltage values and encoder pulses into angular positions and resistances of the potentiometer.

In order to calibrate the potentiometer, the potentiometer wiper is initially rotated to a first stop position. Since the encoder only generates pulses as it rotates, it is important that the encoder is in a known position before it is rotated so that the microprocessor can monitor the wiper position. Typically, the first stop position represents the maximum resistance of the potentiometer. When the potentiometer reaches the first stop position, the microprocessor records the position of the wiper. After recording the position of the wiper, the microprocessor operates a motor to rotate the potentiometer wiper from the first stop position to a second stop position. The first and second stop positions represent a resistance range to be calibrated, which is usually the physical movement limits of the wiper within the potentiometer, and should not change as the potentiometer is used. As the wiper moves from the first stop position to the second stop position, the data acquisition device records the voltage related to the resistance of the potentiometer upon receipt of each encoder pulse from the encoder. Based on the recorded voltages, the microprocessor is able to generate a set of forward resistance values, wherein each value is associated with an angular position of the wiper.

As the potentiometer approaches the location of the second stop position, the rotation of the wiper is stopped and then reversed to move the wiper from the second stop position to the first stop position. During this reverse movement, the data acquisition device again records the voltage related to the resistance of the potentiometer upon receiving an encoder pulse from the encoder. In this manner, the microprocessor is able to generate a set of reverse resistance values. Since the wiper within the potentiometer is relatively flexible, this flexibility can cause some of the hysteresis inherently associated with the potentiometer. In addition, as the wiper is moved in opposite directions, the coupling mechanism between the potentiometer and the drive shaft can cause the forward resistance value and the reverse resistance value to be different for the same angular position of the wiper.

After the forward and reverse resistance values have been measured, the microprocessor combines the forward and reverse resistance values to generate a set of average resistance values for each angular position of the wiper between the first and second stop positions. In this manner, the microprocessor generates an average resistance value for each position of the wiper, thereby reducing the hysteresis effect caused by the physical characteristics of the wiper within the potentiometer, the coupling apparatus, and the electrical hysteresis.

After the average resistance values have been determined, the microprocessor operates a label marking station to produce a label having indicia representing the actual angular position for selected resistance values within the individual potentiometer.

Other features and advantages of the invention may be apparent to those skilled in the art upon inspecting the following drawings and description thereof.

BRIEF DESCRIPTION OF THE DRAWINGS

The drawings illustrate the best mode presently contemplated of carrying out the invention. In the drawings.

DETAILED DESCRIPTION OF THE DRAWINGS

Figure 1:
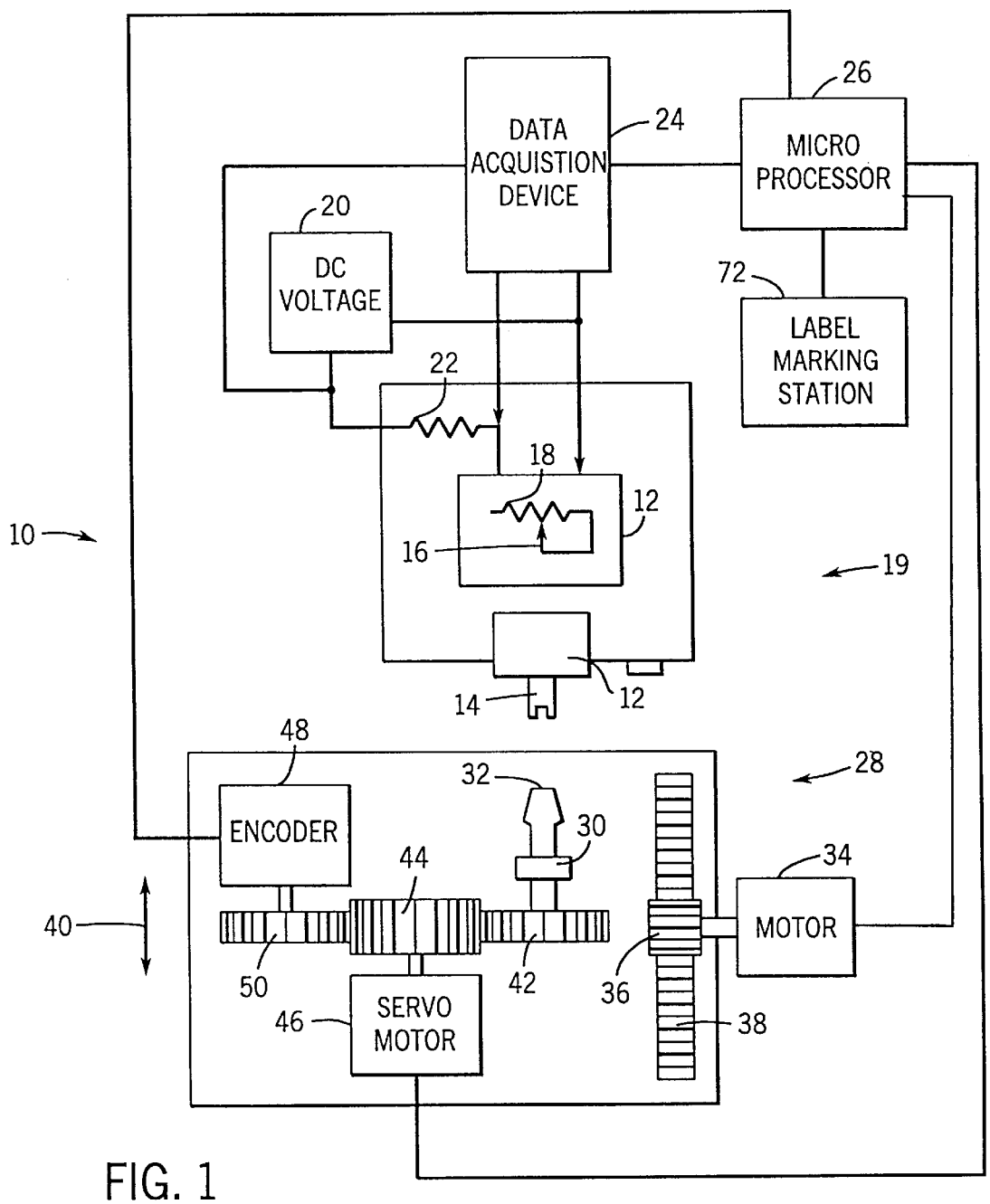
FIG. 1 is a schematic view showing the interaction between the potentiometer and the measuring and drive units for use in the potentiometer calibration method of the invention.

FIG. 1 illustrates the potentiometer calibration system of the present invention, as indicated by reference numeral 10. The calibration system 10 is used to calibrate a potentiometer 12 in order to determine accurate resistance values for different positions of a control shaft 14 forming a part of potentiometer 12. The control shaft 14 is coupled to a connection element, such as a wiper 16 within the potentiometer 12 that is slidably movable between two ends of a portion of resistive material 18. The wiper 16 includes a connection point that provides a selectively variable resistance ranging from a potentiometer minimum to the full resistance of the potentiometer 12. Although the potentiometer 12 is described as including a wiper 16, it should be understood that other elements that allow the output resistance of the potentiometer 12 to be varied could be used.

Figure 4:
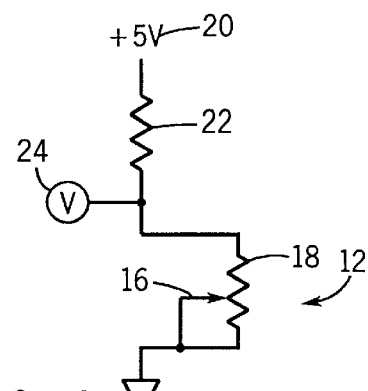
FIG. 4 is a schematic view showing the measuring circuit in the measuring unit of FIG. 1 used to determine the resistance value of the potentiometer as the wiper is moved.

The calibration system 10 generally includes a measuring unit 19 having a constant DC voltage source 20 connected to one end of the resistive material 18 in the potentiometer 12 through a resistor 22. The resistor 22 and the potentiometer 12 combine to create a voltage divider, as shown in FIG. 4. The potentiometer 12 is also connected to a data acquisition device 24 that is positioned to measure the voltage at the connection between the resistor 22 and the potentiometer 12, as best shown in FIG. 4. Thus, as the control shaft 14 is rotated, the wiper 16 moves along the resistive material 18 to vary the resistance of the potentiometer 12.

As the resistance of the potentiometer 12 changes, the voltage measured by the data acquisition device 24 changes accordingly. By measuring the voltage at the connection between the resistor 22 and the potentiometer 12, the resistance of the potentiometer 12 can be determined by the standard voltage divider equation. Preferably, the resistor 22 is a precision resistor such that the voltage divider formed by the potentiometer 12 and the resistor 22 provide an accurate measurement of the potentiometer resistance. A microprocessor 26 is coupled to the data acquisition device 24 to interpret the voltage measurement from the data acquisition device 24 and convert the voltage into a resistance value. In addition to being connected to the microprocessor 26, the data acquisition device 24 is also connected to the output of the voltage source 20 such that the stability of the voltage source 20 can be monitored by sampling the voltage source 20 each time the resistance voltage is sampled.

The potentiometer calibration system 10 also includes a drive unit 28. The drive unit 28 is used to mechanically rotate the control shaft 14 of the potentiometer 12. In the preferred embodiment of the invention, the potentiometer 12 is a rotary potentiometer including a control shaft 14 that rotates within the potentiometer 12 to change the resistance of the potentiometer 12. The drive unit 28 includes a drive shaft 30 having an engagement end 32 configured to be inserted into the control shaft 14 of the potentiometer 12. The entire drive unit 28, including the drive shaft 30, is moveable into and out of contact with the potentiometer 12 by a motor 34 having a drive gear 36 that interacts with a gear rack 38 included on the drive unit 28. By rotating the drive gear 36, the motor 34 is able to move the drive unit 28 in the direction indicated by arrow 40.

The drive shaft 30 is coupled to a gear 42 that engages a main drive gear 44. The main drive gear 44 is driven by an electrically operated servo motor 46 that can be operated in a forward and reverse direction. The servo motor 46 in turn is coupled to the microprocessor 26, such that the microprocessor 26 can control the operation of the drive shaft 30 through the operation of the servo motor 46.

An encoder 48 is coupled to the main drive gear 44 through an encoder gear 50. The encoder 48 is also coupled to the data acquisition device 24 and the micro-processor 26 through a data line. The encoder 48 is configured to generate a specific number of electronic pulses for each revolution of the encoder gear 50. Since the encoder gear 50 is coupled to the drive shaft 30 through the main drive gear 44 and the gear 42, a simple calculation based on the diameters of the gear 42, the main drive gear 44, and the encoder gear 50 can be performed to determine the ratio between a revolution of the encoder gear 50 and a corresponding number of revolutions of the drive shaft 37.

In an illustrative embodiment of the invention, the encoder 48 generates 1,000 uni-phase pulses for each revolution of the encoder gear 50. By performing simple arithmetic calculations, the amount of angular rotation of the drive shaft 30 for each pulse of the encoder 48 can be determined. Thus, the amount of angular rotation of control shaft 14 of potentiometer 12 can be determined for the period between each encoder pulse. Since the encoder 48 is coupled to the microprocessor 26, the microprocessor can monitor the rotation of the control shaft 14 through the series of encoder pulses generated by encoder 48. For example, the illustrative embodiment of the potentiometer calibration system 10, each pulse from the encoder 40 represents a 0.20° rotation of the control shaft 14. Thus, every time an encoder pulse is received, the microprocessor 26 determines that the control shaft 14 has rotated 0.20°. The encoder 48 can be one of many commercially available incremental encoders, such as the Compumotor 6200 2-Axis Indexer available from Parker Hannifin.

Figure 3:
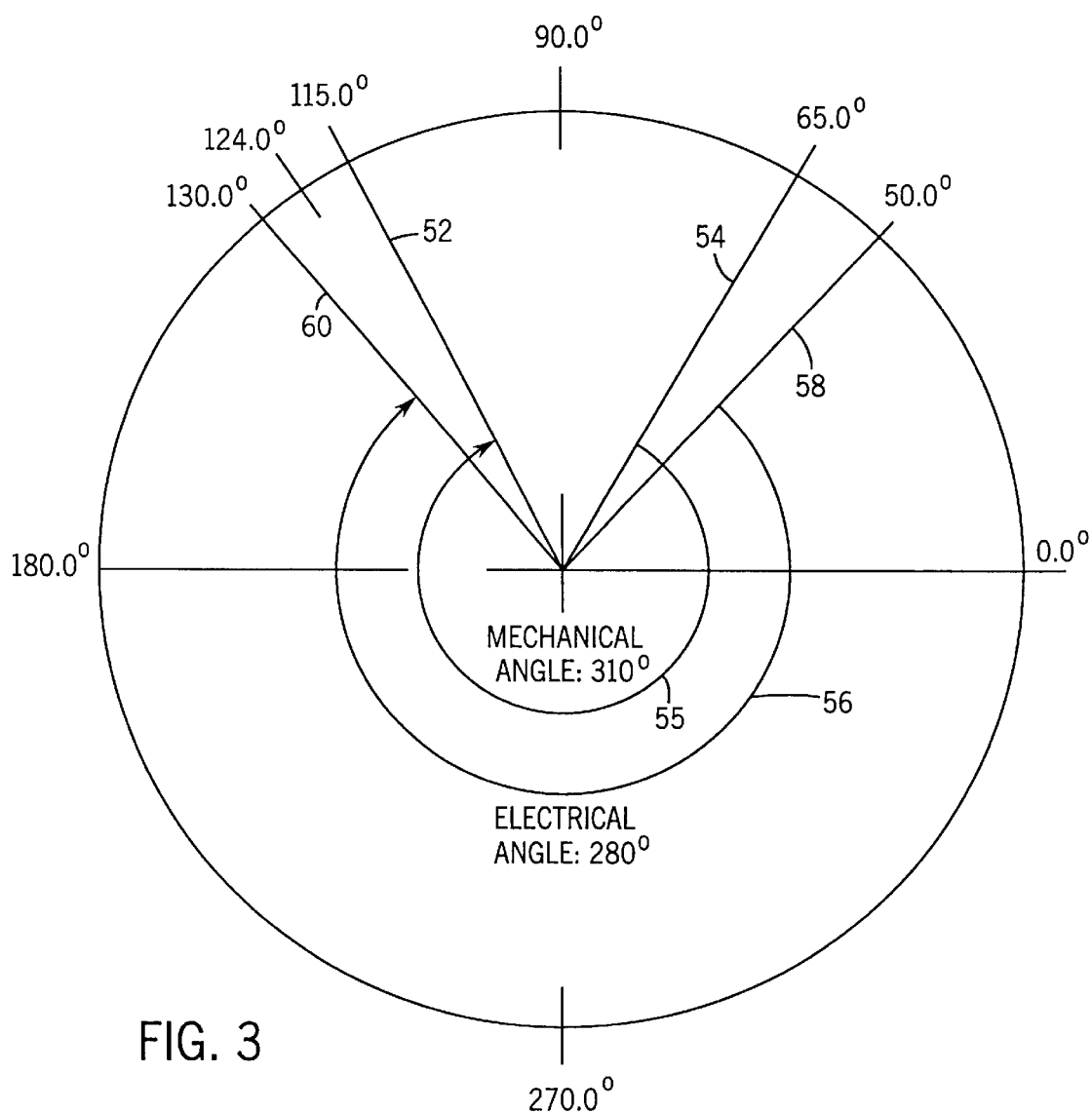
FIG. 3 is a schematic diagram illustrating the range of wiper movement within a rotary potentiometer.

FIG. 3 is a schematic diagram illustrating the range of motion of a typical rotary potentiometer utilized in the preferred embodiment of the invention. The wiper 16 within the potentiometer 12 is physically movable between a first stop position 52 and a second stop position 54. Although the wiper 16 within the potentiometer is movable approximately 310° between the first stop position 52 and the second stop position 54 as shown by arrow 55, the effective electrical angle over which the wiper 16 moves within the rotary potentiometer is only approximately 280°, as illustrated by the rotational arrow 56. When the wiper 16 within the potentiometer 12 is moved from the first stop position 52, which represents the highest resistance value of the potentiometer 12, the resistance of the potentiometer decreases until the wiper reaches a position represented by reference numeral 58. This position 58 is located several degrees before the second stop position 54, such that the potentiometer 12 reaches its lowest resistance value at position 58. The distance between the position 58 and the second stop position 54 is called a deadspace for the potentiometer 12.

When the direction of the potentiometer wiper rotation is reversed, such that the wiper moves from the second stop position 54 to the first stop position 52, the resistance of the potentiometer increases until the wiper reaches a position represented by the reference numeral 60, which is several degrees before the first stop position 52. Thus, the potentiometer 12 includes a deadspace slightly before both the first stop position 52 and the second stop position 54. For this reason, the electrical angle represented by arrow 56 is slightly less than the mechanical angle represented by arrow 55. This feature of the potentiometer 12 can also be seen by examining the graphs in FIGS. 5 and 6, as will be discussed below.

The method of calibrating the potentiometer 12 according to the present invention will now be discussed. Initially, the potentiometer 12 is positioned within the measuring unit 19 with its control shaft 14 extending outward as shown in FIG. 1. With the potentiometer 12 inserted into the measuring unit 19, the motor 34 is operated to insert the drive shaft 30 into the control shaft 14 of the potentiometer 12.

Figure 5:
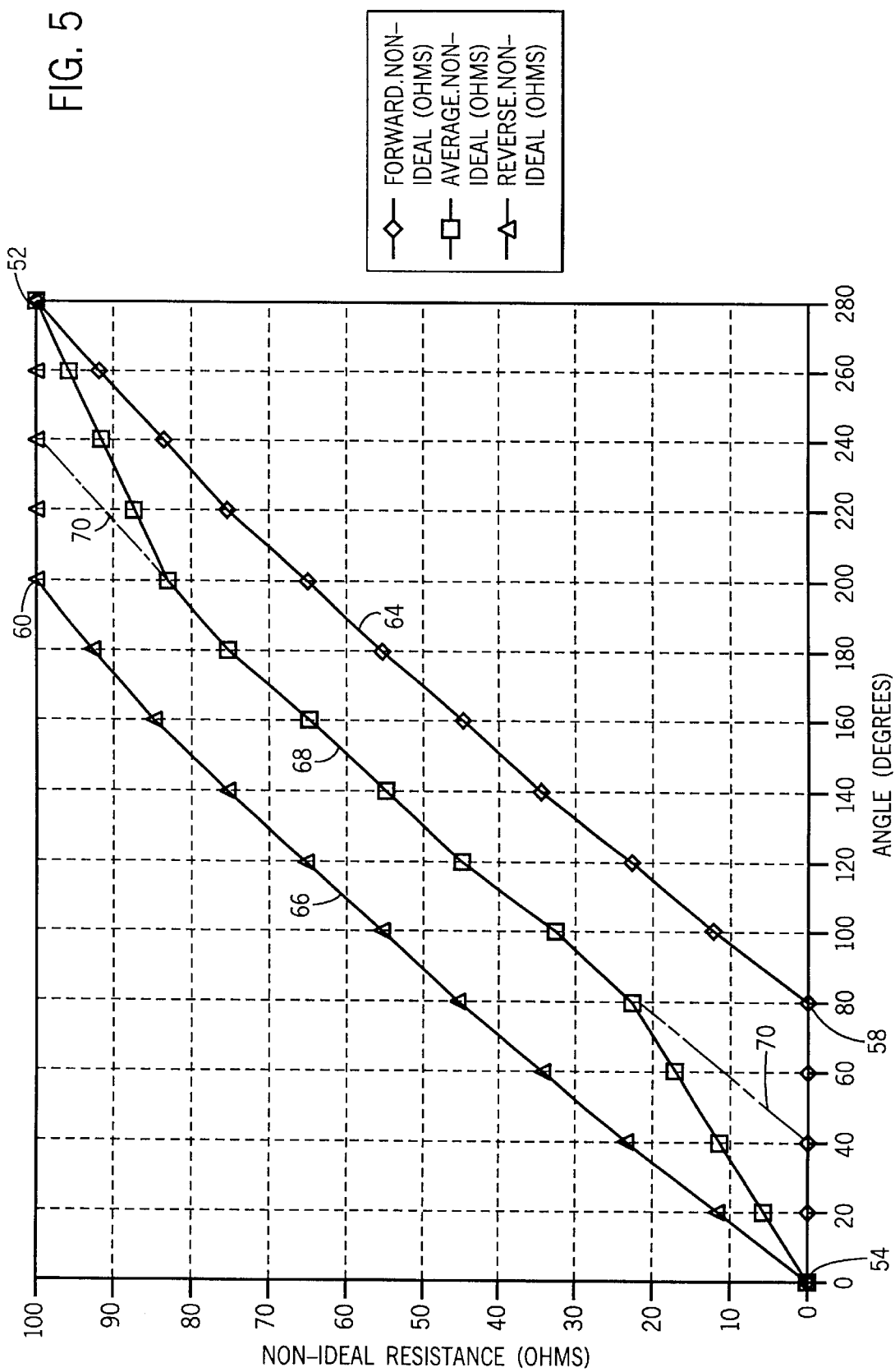
FIG. 5 is a graph illustrating the forward, reverse, and average resistance for each angular position of a non-ideal potentiometer.

Once the drive shaft 30 engages the control shaft 14, the microprocessor 26 operates the servo motor 46 to rotate the drive shaft 30 until the potentiometer 12 reaches its maximum clockwise position, represented by the first stop position 52. In the preferred embodiment of the invention, when the potentiometer 12 is at the first stop position 52, the data acquisition device 24 records the position using the encoder 48. Since the encoder 48 only generates pulses representing incremental movement of the potentiometer 12, it is important to move the potentiometer 12 to one of the stop positions so that the microprocessor 26 has a defined starting position. As can be seen in FIG. 5, which represents the resistance characteristics of a non-ideal potentiometer, the microprocessor 26 records the maximum resistance value and the angular position of the control shaft 14.

After the maximum resistance measurement has been made at the first stop position 52, the microprocessor 26 operates the motor 46 to rotate the drive shaft 30 in a counter-clockwise direction, such that the wiper 16 moves from the first stop position 52 to the second stop position 54. As the wiper 16 is moved away from the first stop position 52, the encoder 48 generates a pulse for each predetermined angular movement of the drive shaft 30 and control shaft 14.

In the preferred embodiment of the invention, the data acquisition device 24 records the voltage across the potentiometer 12 each time a pulse is received from the encoder 48. In this manner, the data acquisition device 24 compiles an array wherein each member of the array includes a voltage value and an index number that is related to the receipt of each encoder pulse. After the entire array has been recorded by the data acquisition device 24, the microprocessor 26 can interrogate the data acquisition device 24 and process the recorded array. From the recorded array, the microprocessor 26 can determine the resistance of the potentiometer 12 for each time an encoder pulse was received. Additionally, the microprocessor can relate each resistance value to an angular position of the wiper 16 by counting the number of encoder pulses that were received when the resistance value was recorded. By using the data acquisition device 24 to compile an array, the microprocessor 26 can process the array after the wiper 16 has completed its movement. In this manner, the microprocessor 26 can perform other functions while the data acquisition device 24 is compiling the array. This feature is particularly desirable, since the data acquisition device 24 can compile such an array without latency between the encoder pulse edge and the triggering of the voltage samples..

In addition to the preferred embodiment discussed above, it is also contemplated that the microprocessor 26 could be used to record the resistance of the potentiometer 12 only at desired positions of the wiper. In this embodiment, the microprocessor 26 would receive pulses from the encoder 48 and thereby monitor the position of the wiper 16. When the wiper 16 reaches a desired position, the micro-processor 26 would then read the voltage across the potentiometer 12 to determine the resistance of the potentiometer 12. In this alternate embodiment, the micro-processor 26 would monitor the position of the wiper 16 and make resistance measurements at desired positions. These desired positions could be as close or far apart as desired by the user.

Referring again to FIG. 5, the forward movement of the potentiometer wiper 16 is represented by line 64. Although specific angular and resistance values are shown in FIG. 5, FIG. 5 is meant to be a representative figure illustrating a possible set of resistance curves for a non-ideal potentiometer. As the potentiometer wiper reaches the position 58, the resistance value of the potentiometer 12 reaches zero slightly before the second stop position 54. In addition to measuring the resistance values of the potentiometer, the microprocessor 26 can determine the mechanical and electrical angle over which the potentiometer is moveable.

Once the wiper to approaches the second stop position 54, the microprocessor reverses the direction of the servo motor 46 such that the potentiometer wiper 16 is moved in a reverse, clockwise direction from the second stop position 54 to the first stop position 52. As the wiper is moved in the clockwise direction, the encoder 48 again generates a series of encoder pulses that are received by the microprocessor 26. Upon receipt of each encoder pulse, the data acquisition device 24 records the voltage across the potentiometer 12. In the same manner discussed above, the data acquisition device 24 can compile a second array of voltage values related to the encoder pulses. Since each encoder pulse represents a known amount of rotation of control shaft 14, the microprocessor 26 then determines the resistance of the potentiometer 12 and the angular position of the control shaft 14. As shown in FIG. 5, a forward line 66 reaches the maximum resistance of the potentiometer slightly before the first stop position 52.

In an alternate embodiment, during the reverse sweep of the wiper, the micro-processor 26 can monitor the position of the wiper 16 through the pulses from the encoder 48. As was discussed above, the microprocessor 26 can then read the resistance of the potentiometer 12 when the wiper reaches a desired angular position.

As can be seen by comparing the forward line 64 and the reverse line 66 from FIG. 5, the resistance of the potentiometer 12 varies depending on the direction of movement of the wiper 16. This difference in the resistance value for the same position of the wiper 16 depending on the direction of wiper movement results in a pair of lines shifted by the inherent hysteresis found in the potentiometer. To compensate for this hysteresis, the forward line 64 and the reverse line 66 are combined by the microprocessor 26 to generate an average resistance line 68 for the potentiometer 12. The average resistance line 68 is an averaged sum of the forward and reverse resistance values measured by the microprocessor between the two preliminary stop points 52 and 54. However, the average line 68 between point 58 and the second stop point 54 is slightly inaccurate, since the average of the forward line 64 and the reverse line 66 includes a zero value for the forward line 64 between point 58 and the second stop point 54. Thus, it has been found that extrapolating the average line 68, as shown by dashed line 70, has proven to be a more effective average for the resistance of potentiometer between the point 58 and the second stop point 54. A similar extrapolation is performed between point 60 and the first stop point 52, as represented by the dashed line 70. Therefore, although line 68 has been described as an "average" of the forward line 64 and the reverse line 66, the average line 68 is an approximate average including composition for the dead spots in the potentiometer 12.

Figure 2:
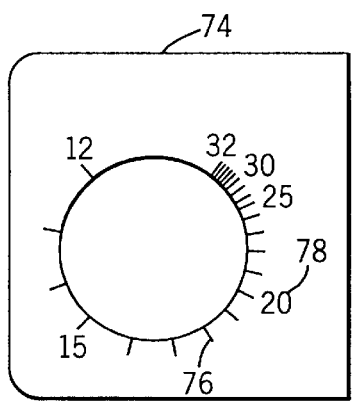
FIG. 2 is a sample printed label generated using the potentiometer calibration method of the invention showing the indicia corresponding to the angular position of selected potentiometer resistances.

After the average resistance line 68 has been determined by the microprocessor 26, the microprocessor 26 can be used to operate a label marking station 72 to generate a label 74, as shown in FIG. 2. The label 74 includes a series of indicia, shown as both graduation marks 76 and numerical labels 78 in the preferred embodiment. The microprocessor 26 operates the label marking station 72 to generate an individual label 74 for each individual potentiometer 12 tested by the potentiometer calibration system 10. In this manner, the potentiometer calibration system 10 individually marks each potentiometer based on the actual resistance characteristics within the potentiometer itself. Typically, the user of the potentiometer calibration system 10 predetermines several resistance values for which a numerical label 78 is desired. The label marking station 72 then prints a label having these resistance values positioned in the corrected angular positions based on the average resistance values determined by the microprocessor 26 and the encoder 48.

The numerical labels 78 contained on each label 74 can represent either selected resistance values in ohms and the corresponding angular position of the wiper 16 within the potentiometer 12, or can be used to indicate other electronic measurements useful for the device into which the potentiometer 12 is inserted. For example, the numerical labels 78 could represent current or voltage values from other important positions in an electronic circuit that depend upon the potentiometer 12.

Figure 6:
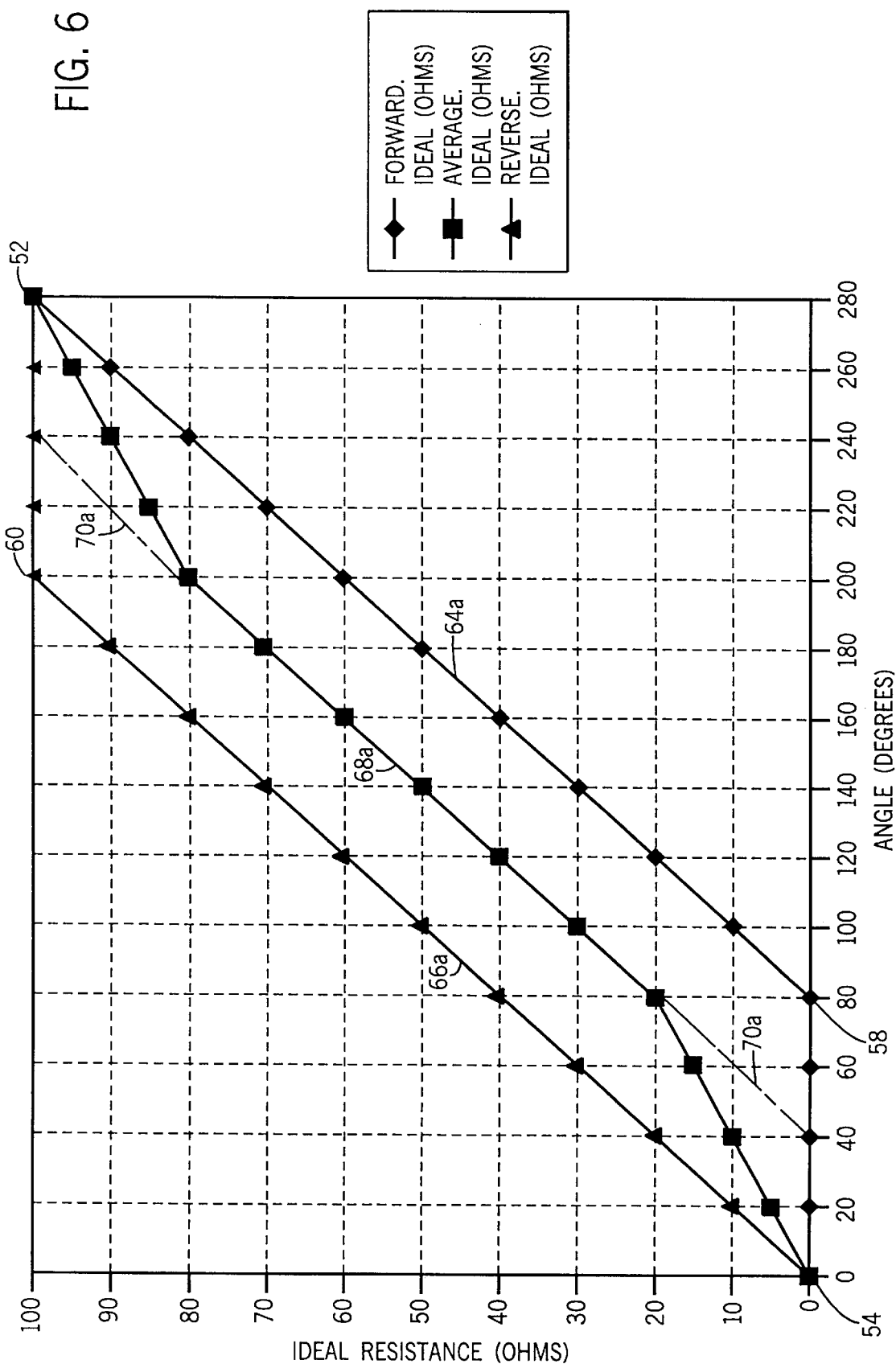
FIG. 6 is a graph illustrating the forward, reverse and average resistance for each angular position of an ideal potentiometer.

FIG. 6 shows the forward line 64a, reverse line 66a and average resistance line 68a for an ideal potentiometer. The method of measuring the forward resistance and reverse resistance values for an ideal potentiometer are identical to those identified above.

Figure 7:
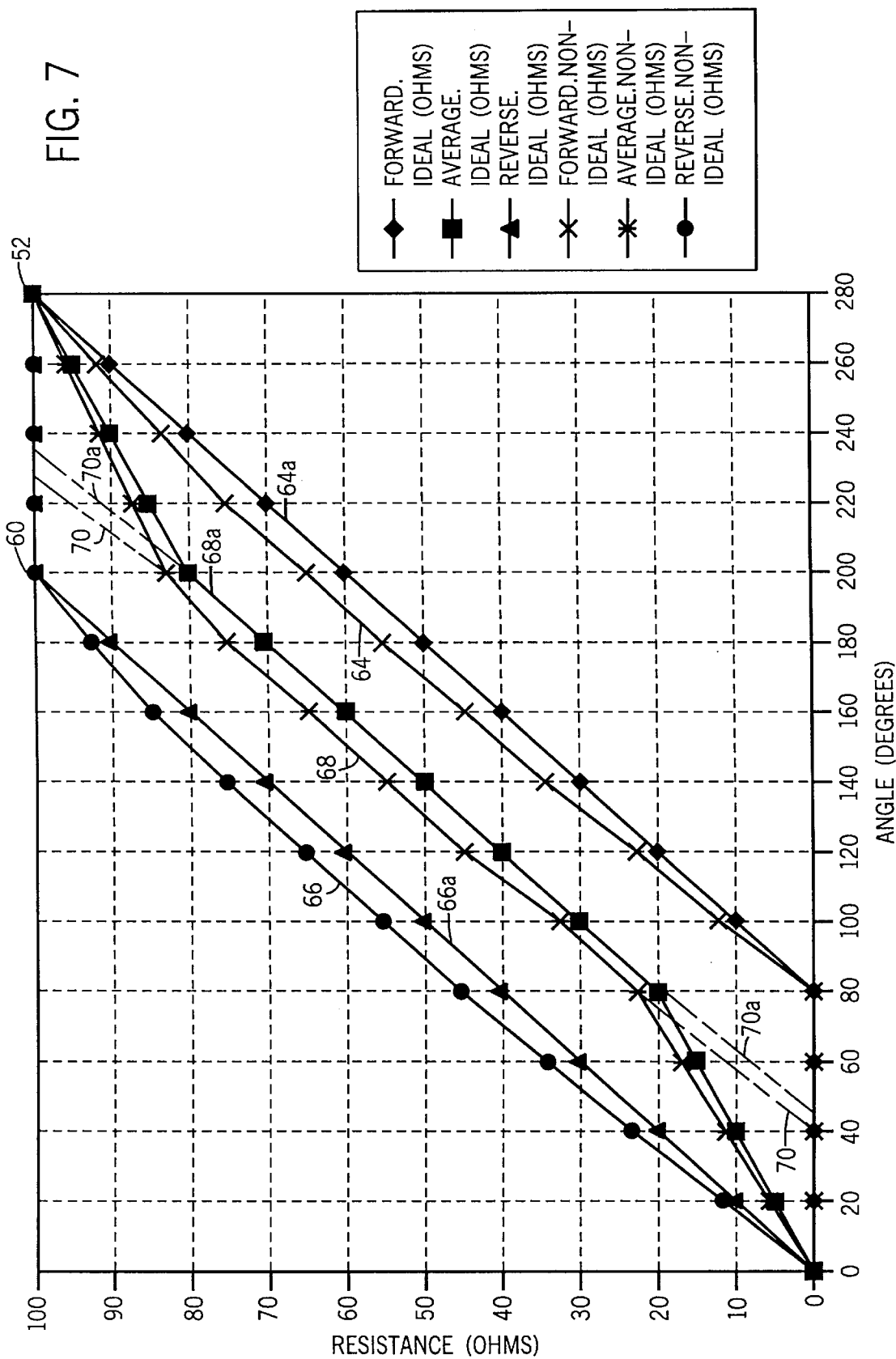
FIG. 7 is a combined graph illustrating the ideal and non-ideal resistance values shown in FIGS. 5 and 6.

FIG. 7 is a combination of FIGS. 5 and 6, showing the variation between the non-ideal potentiometer and the ideal potentiometer. As discussed, the calibration method previously described works equally well with either a non-ideal potentiometer or an ideal potentiometer, such that the method can be used in a large number of situations.

Along with being used for potentiometers, the method of the present invention can also be used with other types of variable devices, since the method of the invention measures the resistance in both a forward and a reverse direction and averages the measurement to generate an average curve for the device that compensates for the hysteresis found in the device and surrounding components.

It is recognized that various equivalents, alternatives and modifications to the invention as described are possible. Such equivalents, alternatives and modifications should be considered to fall within the scope of the following claims.

I claim:

1. A method of calibrating a device having a connection element movable between maximum and minimum resistance values corresponding to opposing first and second stop positions, comprising the steps of:

coupling an encoder to the device such that the encoder generates an output pulse upon a defined amount of angular movement of the connection element;

coupling the device to a data acquisition device operable to measure the resistance across the device between the connection element and a connection terminal of the device, wherein the resistance across the device changes upon movement of the connection element rotating the connection element from the first stop position to the second stop position;

measuring the resistance of the device in response to selected output pulses generated by the encoder as the connection element is moved from the first stop position to the second stop position; and generating a set of resistance values for the device, each of the resistance values corresponding to an angular position of the connection element.

2. The method of claim 1 further comprising the step of recording the angular position of the connection element in response to each selected output pulse generated by the encoder such that each measured resistance value corresponds to a recorded angular position of the connection element.

3. The method of claim 1 wherein the resistance values of the device are recorded upon every output pulse generated by the encoder.

4. The method of claim 3 further comprising the step of recording the angular position of the connection element in response to every output pulse generated by the encoder such that each measured resistance value corresponds to a recorded angular position of the connection element.

5. The method of claim 1 wherein the resistance values of the device are measured at preselected angular positions of the connection element, each of the preselected angular positions being separated by multiple encoder pulses, such that the resistance values of the device are measured only at selected encoder pulses.

6. The method of claim 1 further comprising the step of determining the amount of time between pulses from the encoder, wherein the time between pulses from the encoder is used to calculate the speed of movement of the connection element.

7. The method of claim 1 wherein the change in resistance value from a reference resistance value is used to calculate the relative speed of the connection element.

8. The method of claim 1 wherein the change in resistance value from a reference resistance value is used to calculate the absolute speed of the connection element.

9. The method of claim 1 further comprising the step of marking the device with a plurality of spaced indicia, the indicia indicating the angular position of the connection element for each of several predetermined resistance values based on the set of resistance values generated as the connection element is moved from the first stop position to the second stop position.

10. A method of calibrating a device having a connection element movable between maximum and minimum resistance values corresponding to opposing first and second stop positions, comprising the steps of:

coupling a position indicating component to the device, wherein the position indicating component is operable to determine the instantaneous angular rotational position of the connection element as the connection element rotates from the first stop position to the second stop position;

coupling the device to a data acquisition device operable to determine the resistance across the device between the connection element and a connection terminal of the device, wherein the resistance across the device changes upon movement of the connection element rotating the connection element from the first stop position to the second stop position;

measuring the resistance of the device and recording the instantaneous rotational position of the connection element at a plurality of rotational positions as the connection element is moved from the first stop position to the second stop position; and generating a set of resistance values for the device, each of the resistance values corresponding to an angular position of the connection element.

11. The method of claim 10 wherein the resistance values of the device are measured at only preselected angular positions of the connection element, wherein the preselected angular positions are detected by the position indicating component.

12. A method of calibrating a device having a connection element movable between maximum and minimum values corresponding to opposing first and second stop positions, comprising the steps of:

coupling a position indicating component to the device, wherein the position indicating component is operable to determine the instantaneous position of the connection element as the connection element rotates from the first stop position to the second stop position;

coupling the device to a data acquisition device operable to determine the value across the device between the connection element and a connection terminal of the device, wherein the value across the device changes upon movement of the connection element moving the connection element from the first stop position to the second stop position;

measuring the value of the device and recording the instantaneous position of the connection element at a plurality of positions as the connection element is moved from the first stop position to the second stop position; and generating a set of measured values for the device, each of the measured values corresponding to a known measured position of the connection element.

* * * * *